United States Patent [19]

Spinelli et al.

[11] Patent Number: 4,472,762
[45] Date of Patent: Sep. 18, 1984

[54] ELECTRONIC CIRCUIT INTERCONNECTION SYSTEM

[75] Inventors: Thomas S. Spinelli, Attleboro, Mass.; William G. Manns; Donald F. Weirauch, both of Dallas, Tex.

[73] Assignee: Texas Instruments Incorporated, Dallas, Tex.

[21] Appl. No.: 438,137

[22] Filed: Nov. 1, 1982

Related U.S. Application Data

[62] Division of Ser. No. 191,039, Sep. 25, 1980, Pat. No. 4,385,202.

[51] Int. Cl.³ .............................................. H05K 1/09
[52] U.S. Cl. ................................ 361/386; 174/68.5; 361/387; 361/388; 361/403
[58] Field of Search ............... 174/68.5; 361/386, 387, 361/388, 403, 400

[56] References Cited

U.S. PATENT DOCUMENTS

| | | | |
|---|---|---|---|
| 3,786,172 | 1/1974 | Conley | 174/68.5 |
| 3,801,388 | 4/1974 | Akiyama et al. | 174/68.5 X |
| 3,812,019 | 5/1974 | Needham et al. | 174/68.5 X |
| 3,921,285 | 11/1975 | Krall | 174/68.5 X |
| 3,952,231 | 4/1976 | Davidson et al. | 361/386 |
| 4,137,628 | 2/1979 | Suzuki | 174/68.5 X |
| 4,190,474 | 2/1980 | Bordan et al. | 174/68.5 X |
| 4,256,796 | 3/1981 | Hang et al. | 174/68.5 X |
| 4,301,324 | 11/1981 | Kumar et al. | 174/68.5 |

OTHER PUBLICATIONS

Liu, C. N., Matching the Thermal Coefficients of Expansion of Chips to Module Substrate, IBM Tech. Disc. Bull., vol. 19, #12, May 1977, pp. 4666 & 4667.
Gniewek et al., Titanium Overlay on Metallurgy, IBM Tech. Disc. Bull., vol. 13, #5, Oct. 1970, pp. 1124 & 1125.
Sondej et al., Lamination of Metal Directly to Green Sheet Dielectric Material, IBM Tech. Disc. Bull., vol. 19, #2, Jul. 1976, pp. 431 & 432.
Kerjilian et al., Thermally Enhanced Multilayer Ceramic Substrate Structure, IBM Tech. Disc. Bull., vol. 18, #2, Jul. 1975, pp. 353 & 354.

Primary Examiner—R. R. Kucia
Attorney, Agent, or Firm—James P. McAndrews; John A. Haug; Melvin Sharp

[57] ABSTRACT

An electronic circuit interconnection system provides high density mounting on ceramic chip-carrier integrated circuit devices or other beam-lead, dual-in-line (DIP), tape-automated-bonded (TAB), flip-chip, or direct-mounted i.c. devices with wire-bonded interconnects or the like on an economical, dimensionally-stable, interconnection substrate which has high heat dissipating properties. The substrate has glass components which are fused onto etched metal patterns and which are proportioned relative to the metal patterns so that the heat-expansion properties of the substrate correspond to those of the i.c. devices to maintain bond integrity between the i.c. leads and circuit paths on the substrate and so that the substrate has sufficient heat-dissipating properties to permit the high density i.c. mounting. The substrates incorporate circuit paths, device mounting pads, edge terminals, pin mounting holes and other typical substrate features in the etched patterns in multimetal laminated metal plates of selected thickness which are coated on one or both sides with glass frit fused to the plates. Where substrates with more than one layer are desired, glass-coated plates are stacked with pin mounting holes and the like aligned and the glass coatings are fused together. Metal vias extend through the glass coatings where desired to interconnect metal layers of the substrate.

27 Claims, 27 Drawing Figures

ELECTRONIC CIRCUIT INTERCONNECTION SYSTEM

This application is a division of application Ser. No. 191,039 filed Sept. 25, 1980, now U.S. Pat. No. 4,385,202.

BACKGROUND OF THE INVENTION

The field of this invention is that of interconnection systems for semiconductor components and integrated circuit devices. The invention relates more particularly to interconnecting ceramic chip-carrier types of integrated circuit devices and direct-mounted integrated circuits with wire-bonded interconnects and the like in such a way as to permit high-density mounting of the devices on a low cost substrate while avoiding the interconnection-bond integrity problems and heat-dissipation problems usually associated with interconnection of such devices.

At the present time, most integrated circuit devices are provided in the form of dual-in-line packages (DIP) which are mounted and electrically interconnected on conventional glass-epoxy printed circuit (p.c.) boards and the like by having device terminals fitted onto plated-through holes in the boards, with or without the use of intermediate mounting sockets. The present invention does not exclude systems incorporating such dual-in-line packages but, with the trend toward increasingly larger numbers of pin-outs, higher speeds, and higher density of i.c. devices, it is found that much larger p.c. board areas are needed to accomodate the devices even when multilayer boards are used. Greater difficulties are encountered in trying to mount larger i.c. devices using DIP packages without damage to device terminals, and the ratio of packaging and mounting cost to i.c. device cost is becoming excessive. As a result, various different types of device packages and/or direct device attachment are being considered for facilitating interconnection at the "board" system level, commonly called the #2 level. For example, leadless ceramic chip-carriers and directly attached i.c. devices and the like have been proposed for permitting higher device mounting density in an interconnection system. However, because of the difference in thermal expansion properties between the ceramic i.c. packages or i.c. devices and the conventional p.c. boards, some compliant lead structure has typically been required between the terminals on the packages or i.c. devices and the circuit paths on the boards to assure suitable interconnection bond integrity. Some of the more recently proposed i.c. devices such as tape-automated-bonded (TAB) devices have been provided with a compliant lead structure but it is then found that the heat-dissipating properties of the conventional low cost p.c. boards are still too limited for permitting any suitable degree of device mounting density. Substrates having ceramic bases and having metal conductors deposited on top of such bases have also been proposed for use for direct i.c. chip or bar attachment or for mounting of ceramic chip carriers but the use of such known ceramic substrates has been limited by cost and fabrication technology and has typically been limited in size to less than about 100 square inches. It would be desirable if an improved electronic interconnection system could be provided for directly attaching i.c. chip or bars or for mounting ceramic i.c. devices as well as other devices of different types in an economical and convenient manner, particularly using substrate means of substantial area greater than about 100 square inches. Such a system should be adapted to provide high device density on a low cost, large scale substrate and the substrate should have heat-dissipating and thermal expansion properties which are compatible with the devices mounted in the system.

BRIEF SUMMARY OF THE INVENTION

The novel and improved electronic circuit interconnection system of this invention includes a single or multilayer substrate in which circuit paths, device mounting pads, lead connections, edge terminals and pin mounting holes and the like are provided in etched metal plates which have thin coatings of glass frit or other inorganic dielectric material or the like fused to one or both sides of the etched plate pattern. In one preferred embodiment, the metal plate patterns are etched from multilayer, composite, clad metal laminates having layers of metal of selected properties which cooperate to provide the substrate with desired electrical conductivity, with desired thermal conductivity and expansion, and with desired etching and glass bonding characteristics. Preferably for example, the etched plate is formed from a laminate or composite material having a layer of copper sandwiched between and metallurgically bonded to two outer layers of a metal alloy having a nominal composition by weight of 42 percent nickel and the balance iron. Such a metal plate is easily bonded to glass frit by fusing of the frit. The plate also displays desirably high electrical and thermal conductivity and also displays suitably low thermal expansion properties. Ceramic chip-carrier types of integrated circuit devices or other i.c. devices or semiconductor components having thermal expansion characteristics generally corresponding to those of the inorganic substrate coating material are then mounted on the substrate and are electrically interconnected to circuit paths and the like on the substrate. In that way, the substrate has thermal expansion properties which are compatible with the thermal expansion properties of the ceramic chip-carrier types of i.c. devices and the like for permitting interconnection of the devices with high connection-bond integrity. In a particularly perferred embodiment of the invention, the system incorporates a multilayer substrate in which the glass-coated patterned metal plates as above described are arranged in stacked relation to each other with pin mounting holes and the like aligned in the metal layers and with the layers secured together by fusing of the glass layer coatings. Where high temperature substrate materials such as glass are used as above described (suitable for 1000° C. for example), the system is particularly well adapted to incorporate low cost hybrid circuit features and to use non-noble metals for both circuit elements and passive components directly in the substrate. The plates are provided with plated vias extending through the aligned holes and through the glass materials for electrically interconnecting the substrate layers where required.

BRIEF DESCRIPTION OF THE DRAWINGS

Other objects, advantages and details of the electronic interconnection system of this invention appear in the following detailed description of preferred embodiments of the invention, the detailed description referring to the drawings in which.

DESCRIPTION OF PREFERRED EMBODIMENTS

Figure 1:
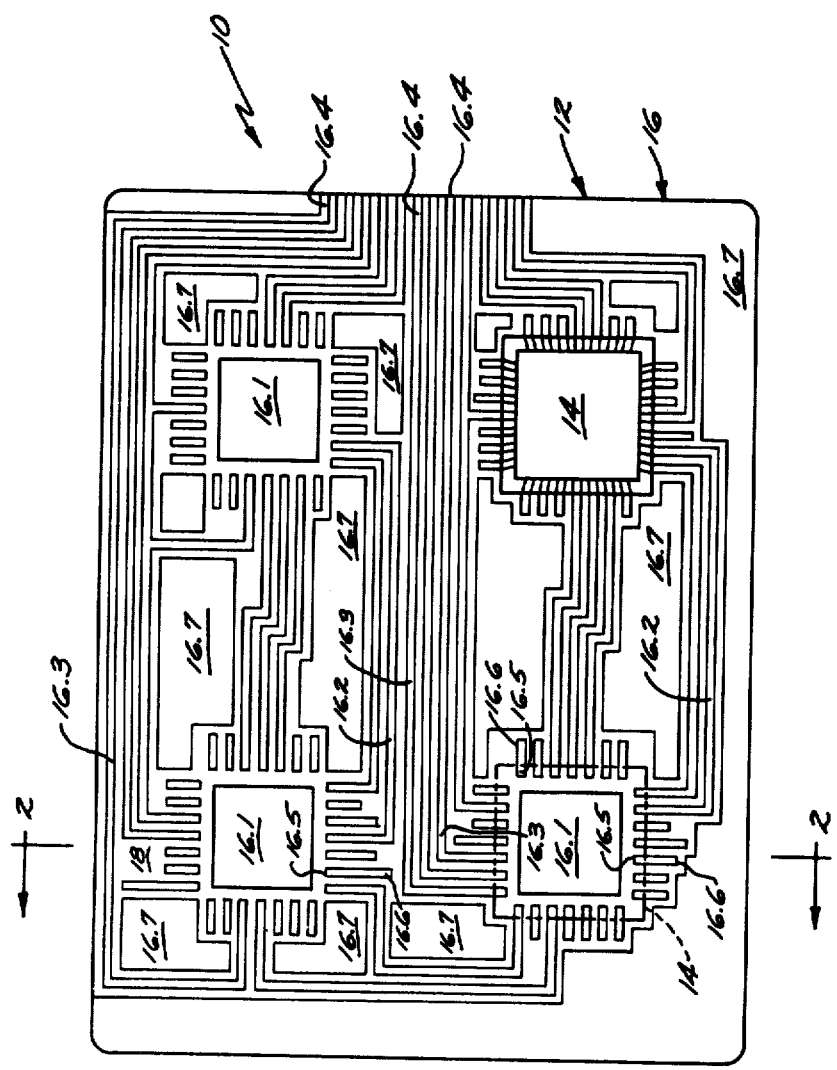
FIG. 1 is a diagrammatic plan view of an interconnection system as provided by this invention.
Figure 2:
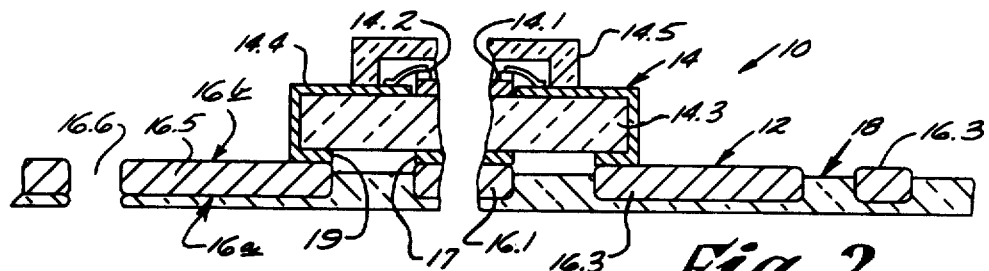
FIG. 2 is a partial section view to enlarged scale along line 2—2 of FIG. 1.
Figure 3:
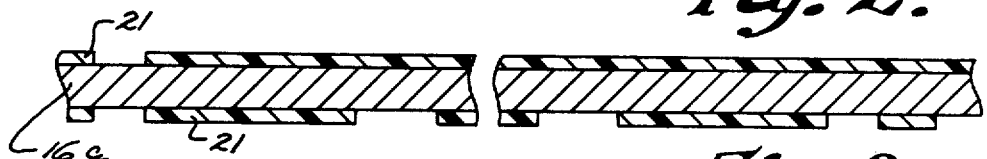
FIGS. 3-6 are partial section views similar to FIG. 2 diagrammatically illustrating manufacture of the substrate used in the interconnection system of FIGS. 1 and 2.

Referring to the drawings, 10 in FIGS. 1 and 2 indicates a preferred embodiment of the novel and improved electronic circuit interconnection system of this invention which is shown to include substrate means 12 having one or more electronic semiconductor means 14 mounted thereon, the substrate means having thermal expansion properties corresponding to those of the semiconductor means and having sufficient thermal conductivity to maintain the semiconductor means at safe temperatures during system operation.

In accordance with this invention, the substrate means includes metal layer means such as the metal layer 16 which, as is diagrammatically illustrated in FIGS. 1 and 2, has different portions defining various different circuit paths means and the like such as are typically provided in an interconnection substrate. For example, the metal layer 16 preferably includes semiconductor device mounting pads 16.1. The metal layer also typically provides a plurality of circuit path conductors 16.2 extending between different semiconductor device locations on the substrate means, a plurality of circuit path conductors 16.3 which extend from such device locations to edge terminals 16.4 located at the edge of the substrate means, and other circuit conductors 16.5 extending from device locations to the location of substrate holes 16.6 which can mount connector pins or plated-through metal vias for connecting to other metal layer means in the substrate or the like. The metal layer means 16 also preferably includes heat-dissipating layer portions 16.7 as shown in FIGS. 1 and 2. The material of the metal layer 16 typically comprises an iron alloy or other material which has thermal properties most compatible with the i.c. device or package to be used with the metal layer. Other metals such as copper, low carbon steel or the like are also needed. In a preferred embodiment, where direct i.c. mounting is contemplated or where ceramic chip carriers are to be used, the metal layer 16 preferably embodies an iron alloy material having a nominal composition by weight of about 42 percent nickel and the balance iron, such an alloy having a very low coefficient of thermal expansion of about $3 \times 10^{-6}$ in./in./° F. Alternately, the layer 16 is formed of other materials having correspondingly low coefficients of thermal expansion such as iron alloys having nominal compositions by weight in the range of about 36 to 50 percent nickel and the balance iron, of about 31 percent nickel, 8 percent chromium, 8 percent cobalt, and the balance iron, of about 32 percent nickel, 15 percent cobalt, 1 percent molybdenum, and the balance iron, of about 38 percent nickel, 7 percent chromium and the balance iron, of about 17 percent chromium and the balance iron, of about 16.5 percent chromium 4.5 percent aluminum, and the balance iron, of about 57 percent cobalt, 9 percent chromium and the balance iron, and of about 23 to 30 percent nickel, 17 to 30 percent cobalt, 0.6 1 to 0.8 percent manganese, and the balance iron. The metal layer means typically have a thickness in the range from about 0.002 to 0.060 inches to provide the substrate means with substantial heat sink properties desired. Preferably, thin copper, gold or other readily solderable materials are provided on selected outer surfaces of the metal layer means by plating or cladding or in other conventional manner for facilitating soldering of components and the like to the metal layer means described below.

In accordance with this invention, an inorganic base means 18 is bonded to selected portions of the metal layer means for securing the circuit path means and the like 16.1-16.7 in selected, spaced, electrically insulated relation to each other, the inorganic base means and the metal layer means being selected and proportioned relative to each other for providing the substrate means with selected thermal expansion and thermal conductivity properties as is further described below. Preferably, all of the metal layer portions described above as well as any other typical substrate features which are incorporated in the metal layer portions are embedded in the inorganic material of the base means 18 so that the inorganic material extends up between adjacent circuit path conductors 16.3 and the like in the metal layer means. In a preferred embodiment of this invention as illustrated in FIGS. 1 and 2, one side 16a of each metal layer portion is embedded in the inorganic base means and the opposite sides 16b of the layer portions are exposed from the embedding means. The inorganic base material 18 preferably comprises any conventional soda-lime glass material or the like which is fused to selected portions of the metal layer 16 but other inorganic materials of relatively low thermal expansion such as porcelain enamels, solder glass frits and other vitreous materials, ceramic materials, alumina or crushed mica or the like are also used within the scope of this invention.

The semiconductor means 14 is of any conventional type and typically embodies portions of an inorganic material having selected relatively low thermal expansion properties and has metal conductor means which are electrically and thermally interconnected with the circuit path means and the like on the substrate means 12 as is further discussed below. For example, in the embodiment of the invention illustrated in FIGS. 1 and 2, a plurality of the circuit path means and the like 16.1-16.7 are provided in a selected pattern at a semiconductor device location such as is indicated by the broken line 16a in FIG. 1. The semiconductor means 14 then comprises a typical ceramic chip-carrier type of integrated circuit unit. That is, the unit has a conventional integrated circuit embodied in a chip 14.1 of semiconducting silicon material as will be understood and has chip terminals 14.2 for use in conventional manner in electrically connecting the integrated circuit of the chip with other electrical circuit means as will also be understood. The chip is mounted on an inorganic ceramic chip-carrier member 14.3 in any conventional manner, usually by soldering the chip to a metallized surface of gold, copper or the like (not shown) plated or deposited on the carrier, and metal conductors 14.4 are electrically connected to the respective chip terminals and are bonded to the carrier member in any conventional way to extend to selected locations of the carrier member, usually at the edge of the underside of the carrier member as is illustrated in FIG. 2. A metallized surface (not shown) deposited at the center of the underside of the carrier member is preferably secured in heat-transfer relation to a semiconductor mounting pad 16.1, usually by soldering to a copper flashing (not shown) provided on the pad for mounting the unit in good heat-transfer relation to the substrate means, and the metal conductors are fixedly secured (by soldering or the like) in electrically and thermally conducting relation to circuit paths 16.2, 16.3 and 16.4. Typically the ceramic i.c. unit has a ceramic or metal cover 14.5 sealed over the i.c. chip. Alternately, the semiconductor means 14 incorporated in the system of this invention comprises conventional beam-lead units, dual-in-line (DIP) units, tape-automated-bonded (TAB) units, flip-chip units, direct-mounted i.c. chips or other conventional semiconductor means.

In that arrangement, the interconnection system 10 provides high density mounting but achieves low cost and reliable mounting and electrical interconnection of the electronic semiconductor means. The ceramic chip-carrier i.c. units 14 are adapted for low cost repetitive or automated manufacture to provide a compact, stable structure and, in the system 10, the units are mounted with high density, in closely spaced relation to each other. The units have fixed solder connections or the like between the units and device mounting pads on the substrate means and also have fixed and secured solder connections between the metal conductors of the ceramic chip carriers and the circuit paths on the substrate means. The units are therefore secured in close heat-transfer relation to the substrate means and form a rugged secured package with the substrate means. Substantial portions of the i.c. units are formed of inorganic ceramic or silicon materials having relatively low coefficients of thermal expansion and the substrate means 12 incorporate corresponding low-expansion metal alloys and substantial portions of inorganic glass or ceramic materials or the like so that the substrate means is dimensionally stable and has thermal expansion properties substantially corresponding to those of the semiconductor means 14. Accordingly, the bonds between the metal conductors 14.4 of the chip carrier and the circuit paths 16.1–16.3 of the substrate means retain their integrity during extensive thermal cycling of the system 10. The iron alloy materials of the metal layer means 16 assure good fused bonding or the like of the inorganic materials 18 to the metal layer means so that the substrate means also displays a long service life during thermal cycling. In addition, the thickness of the metal layer means and the proportions of the metal layer means which are specifically or otherwise devoted to heat-sink or heat-dissipating purposes in the substrate means is selected so that sufficient heat is withdrawn from the semiconductor means and is dissipated from the system by the substrate means for assuring that the semiconductor means are maintained at safe temperatures during system operation.

Figure 4:
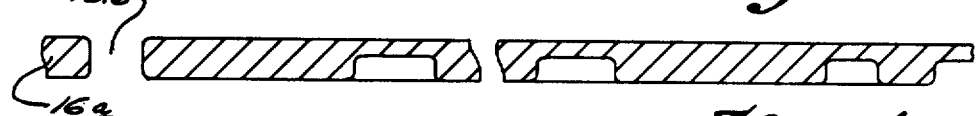
Figure 5:
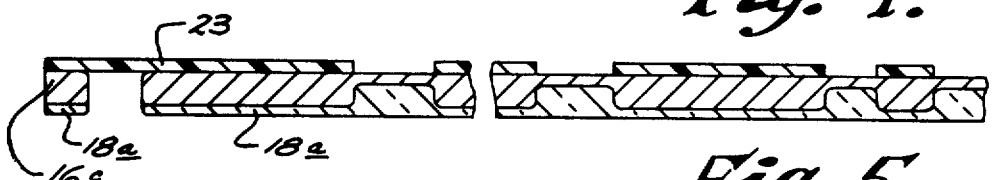
Figure 6:
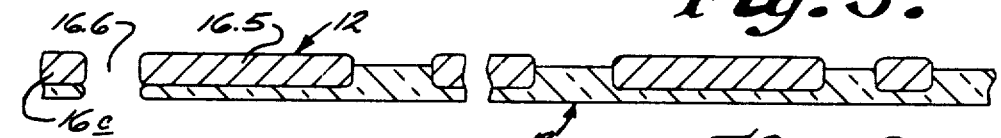

The substrate means 12 used in the system 10 is easily and economically fabricated as is shown in FIGS. 3–6 and 18, thereby to provide a substrate means with the desirable properties as discussed above. That is, the metal plate 16c is chemically cleaned and dimensionally stablized using conventional techniques as is diagrammatically indicated at 20 in FIG. 18. In one such method, the sheet is degreased with a suitable solvent, is rinsed in a water spray, is etched clean in a dilute ferric chloride solution (39° baume), and is dimensionally stablized by firing at 975° C. for 15 minutes in a dry hydrogen atmosphere, the atmosphere reducing or avoiding the formation of oxides on the sheet or plate. The top and bottom of the plate are coated with a conventional photoresist and are processed with conventional photolithographic techniques as is diagrammatically indicated at 22 and 24 in FIG. 18 to provide a mask 21 on the sheet 16c as is diagrammatically illustrated in FIG. 3. The masked sheet is then etched and the masking material is subsequently removed as indicated at 26 and 28 in FIG. 18, thereby to provide the sheet 16c with an aperture 16.6 and with other partially formed substrate features as is shown in FIG. 4. Typically, the sheet is etched in a composition comprising a mixture of 46° baume ferric chloride and hydrochloric acid. The partially processed sheet 16c is then coated with a glass frit 18a which is deposited by screen printing or in other conventional ways to leave the aperture 16.6 open. The glass frit is then heated to be vitrified and fused to the plate as indicated at 30 in FIG. 18 and, as indicated at 32 and 34 in FIG. 18, an additional photoresist is provided and processed on the partially coated plate 16c to form an additional mask 23 as illustrated in FIG. 5. The plate is then further etched as indicated at 36 in FIG. 18 and the mask is again removed to form the finished substrate 12 as illustrated in FIG. 6. It should be understood that many other processes and other etching compositions and the like can also be used in forming the substrate means in accordance with this invention. Any surfaces of the plate 16c to which soldering is to be effected are desirably plated with a material such as copper (not shown) in any conventional manner to facilitate such soldering, particularly where nickel-iron alloys have been used in the plate as above-described. Alternately the original sheet 16c can be provided with a very thin outer copper cladding (not shown) so that, when the plate has been etched and the masks 21 and 23 are removed, soldering to the paths 16.5 is easily effected.

Figure 7:
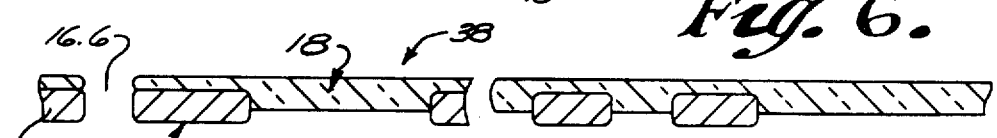
FIGS. 7-8 are partial section views similar to FIGS. 3-6 diagrammatically illustrating manufacture of an alternate embodiment of the substrate shown in FIGS. 3-6.
Figure 8:
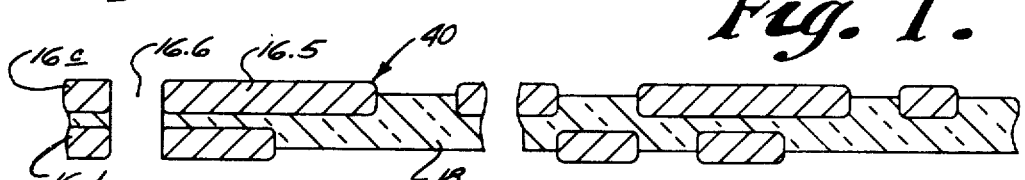

In an alternate embodiment of this invention as illustrated in FIGS. 7 and 8, a similar substrate means 40 is used in the system that is, a substrate means 38 is formed in a similar manner to substrate 12 to have similar or related substrate features such as a substrate aperture 16.6 as formed in the metal layer 16d as shown in FIG. 7. The glass-coated sides of two substrate means 12 and 38 are then abutted; features of the two substrate means such as the apertures 16.6 are aligned as desired; and the glass coatings of the two substrate means 12 and 38 are fused together for securing the substrate means in stacked relation to each other to form the multilayer substrate means 40 as shown in FIG. 8. In that arrangement, additional semiconductor means can be mounted on the metal layer means 16d, or the metal layer means 16d can be electrically connected to the layer 16c by any conventional means (not shown), or the metal layer 16d can provide additional heat-dissipating capacity in the substrate means as may be desired.

Figure 9:
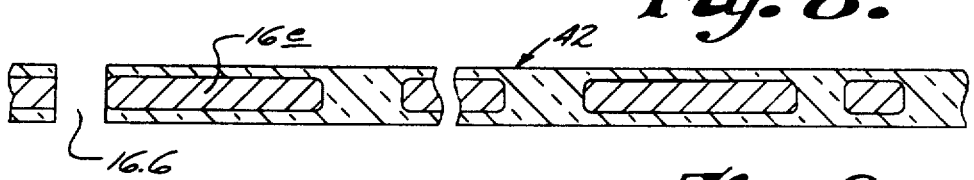
FIGS. 9-11 are partial section views similar to FIGS. 3-8 illustrating other alternate embodiments of the substrates provided by this invention.
Figure 10:
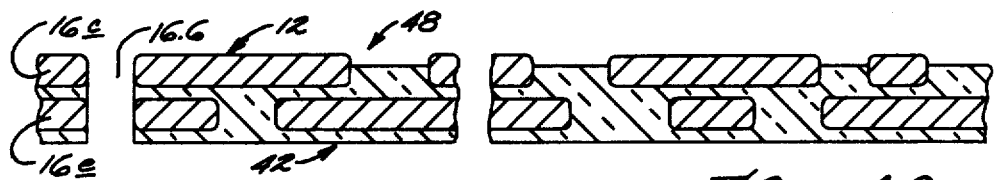
Figure 11:
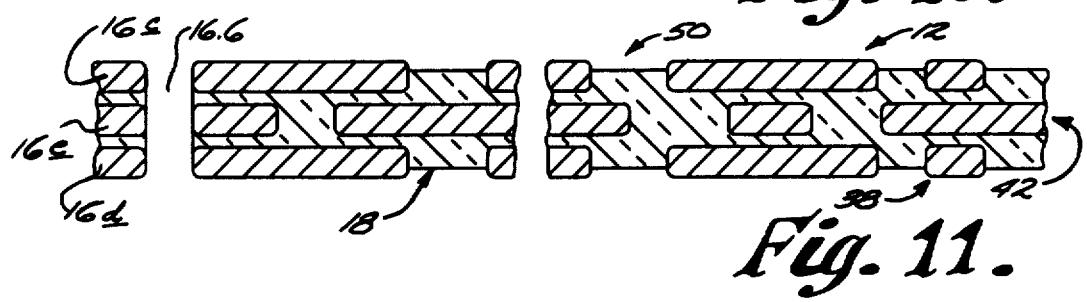

In another alternate embodiment of the interconnection system of this invention as shown in FIGS. 9-11, a substrate layer means 42 is formed with a metal layer 16e which is first processed as described above with reference to the substrate means 12. The layer 16e as thus processed is then further processed as indicated at 44 in FIG. 18 to provide additional glass frit means fused to the plate 16e to cover selected portions of the second side of the plate as is indicated in FIG. 9. As indicated at 46 in FIG. 18, and as is indicated in FIGS. 10 or 11, the substrate layer means 42 is then combined with a substrate means 12 or with a substrate means 12 and 38 or the like to form multilayer substrate means 48 or 50 as shown in FIGS. 10 and 11. Alternately of course, other metal layer combinations within the substrate means are within the scope of this invention.

Figure 12:
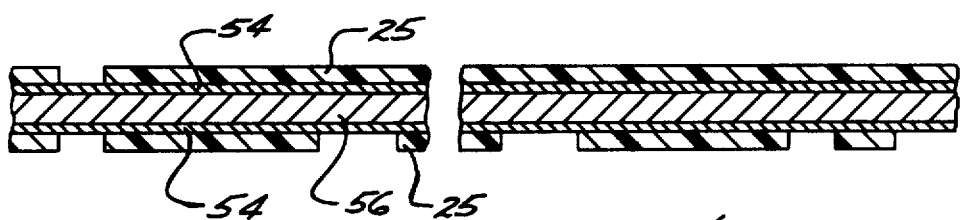
FIGS. 12-16 are partial section views similar to FIGS. 3-11 diagrammatically illustrating other alternate embodiments of the substrates provided by this invention.
Figure 13:
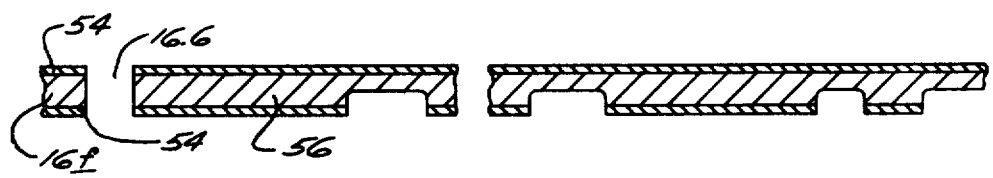
Figure 14:
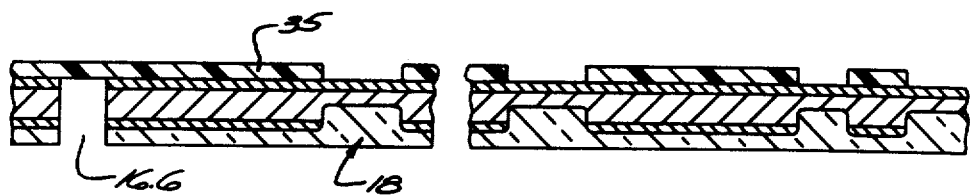
Figure 15:
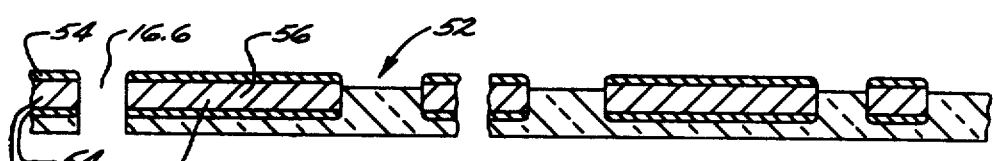
Figure 22:
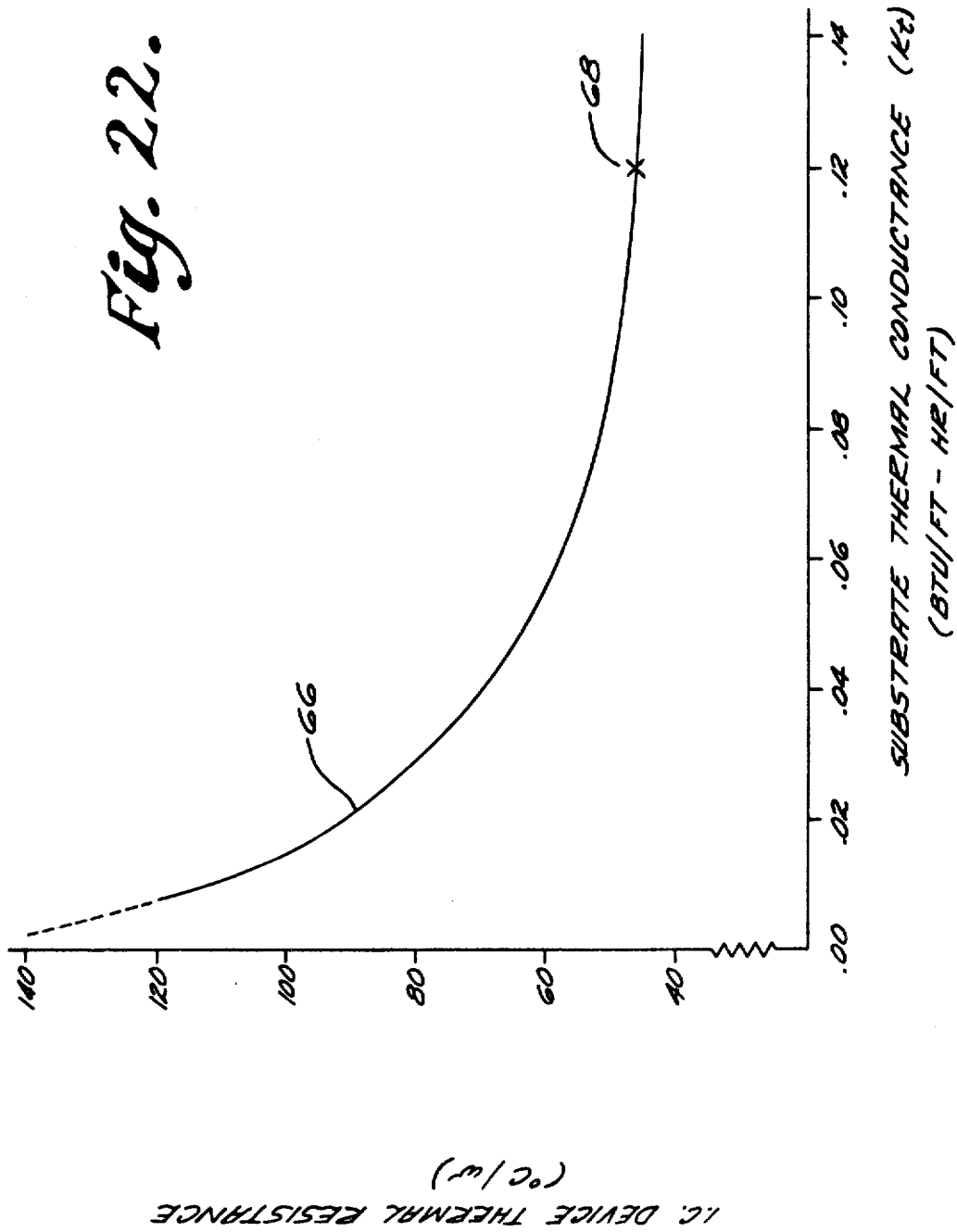
FIGS. 22-23 are graphs indicating characteristics of components used in the interconnection system of this invention.
Figure 23:
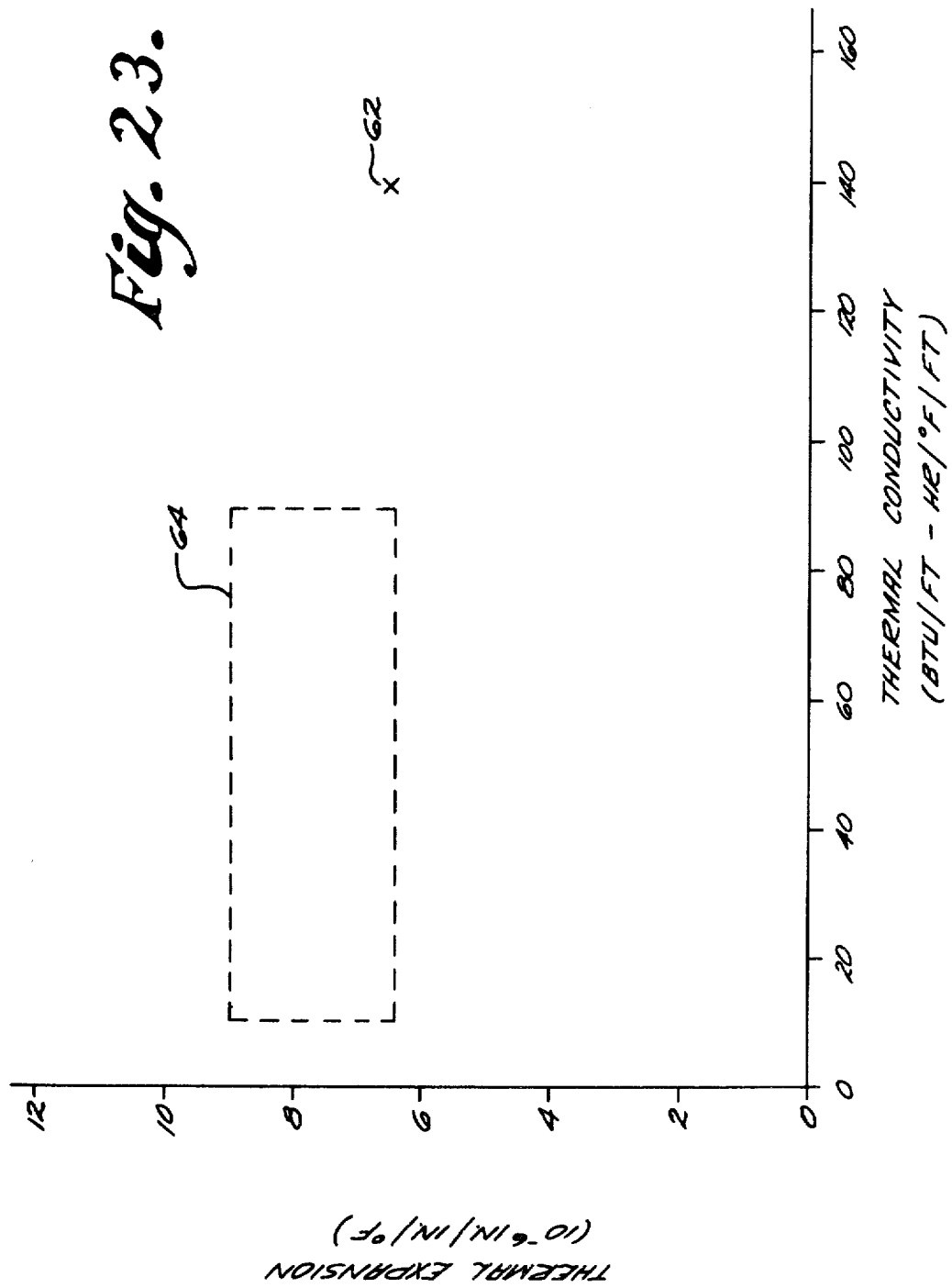

In another alternate embodiment of this invention as shown in FIGS. 12-15, the metal layer 16f embodied in the substrate means 52 comprises a composite metal laminate material as is illustrated in FIG. 12. The laminate preferably has a pair of outer metal layers 54 formed of one of the iron alloy materials previously described above and has a central or core layer 56 formed of a material such as copper or a copper alloy or the like having a relatively high degree of electrical and thermal conductivity. The metal layers of the composite metal laminate are securely joined together by metallurgical roll bonding or the like with or without intermediate interliner layers and the relative thickness of the core and outer layers are selected relative to each other so that they cooperate in providing the substrate means 52 with the desired thermal expansion properties as well as with an improved degree of thermal conductivity. The outer layers 54 of the laminate are preferably of equal thickness so that each circuit path means or the like formed in the metal layer 16f is adapted to lay flat and does not tend to flex during thermal cycling. As will be understood, the substrate means 52 is formed in a manner similar to the substrate 12 as is illustrated in FIGS. 12-15. It will also be understood that multilayer substrate means including various layer combinations as described above are also adapted to incorporate composite metal layer means 16f and 16g as is representitively illustrated at 58 in FIG. 16.

Where the metal layer means incorporate in a substrate means comprised metal laminates as above described, the substrate means are provided with significantly improved thermal properties. Thus, where the metal laminate has equal outer layers of an iron alloy having a nominal composition by weight of about 42 percent nickel and the balance iron clad on a core layer of copper of about the same thickness, the resulting composite material has thermal expansion properties as indicated at 62 in FIG. 23. That is, the thermal expansion properties of the laminate material substantially correspond to those of glass and alumina materials and the like as is indicated by the "window" 64 in FIG. 23. On the other hand, the composite material has significantly higher thermal conductivity properties as is also indicated in FIG. 23. Accordingly, substrate means incorporating such laminates have expansion properties desirably related to those of semiconductor means mounted thereon to provide good interconnection bond integrity but, when the thermal resistance of the various conventional i.c. device units is compared to the thermal conductivity of various substrates as is indicated by the curve 66 in FIG. 22, it is found that the thermal conductivity of the composite material maximizes heat withdrawal from the devices as is indicated at 68 in FIG. 22.

Figure 16:
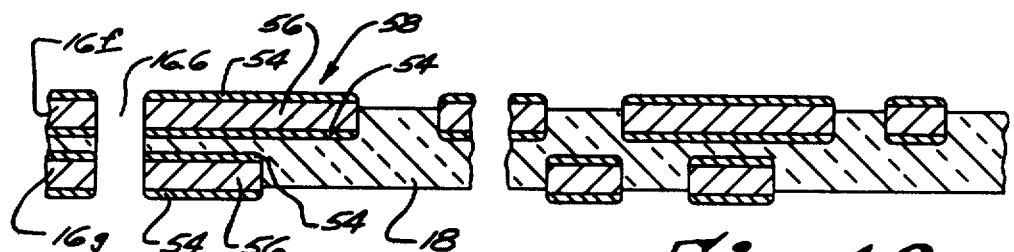
Figure 17:
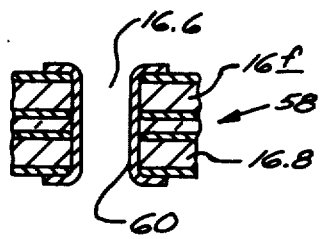
FIG. 17 is a partial section view similar to FIG. 16, diagrammatically illustrating a layer-interconnecting via used in an alternate embodiment of the substrate of this invention.
Figure 18:
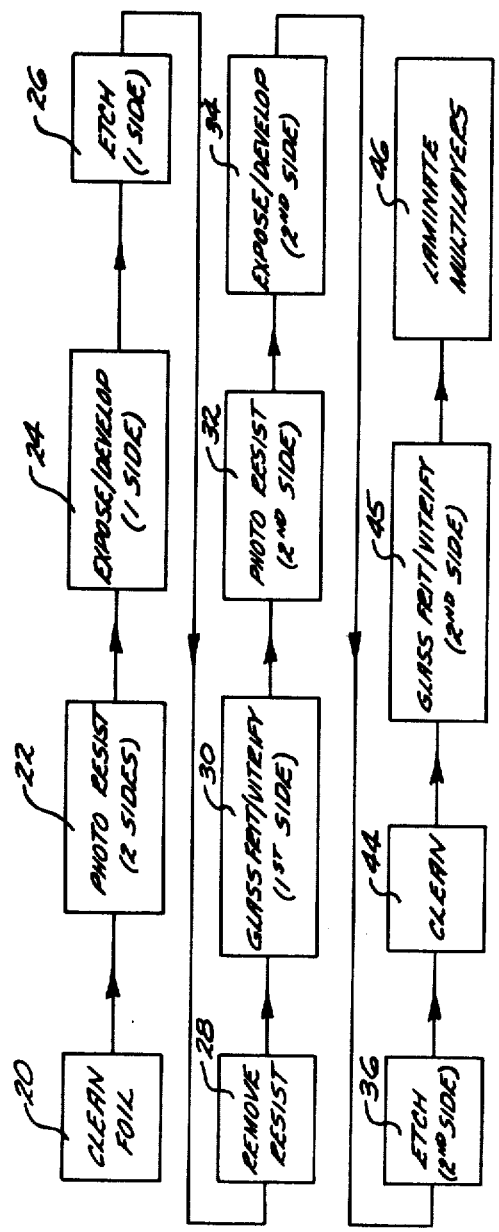
FIG. 18 is a block diagram illustrating steps in a method for making substrates used in the interconnection systems of this invention.

In a typical embodiment of the interconnection system of this invention, metal layer means in the substrate means have selected portions thereof electrically interconnected by plated-through metal holes or vias in the substrate means as is shown in FIG. 17. That is, where apertures 16.6 are aligned in the metal layers 16f and 16g in the substrate means 58 as shown in FIG. 16, the metal layer means are electrically interconnected by forming a plating 60 of copper or the like in the aperture 16.6 in any conventional manner as is shown in FIG. 17. In preferred embodiments of the invention, where plated through holes 16.6 are to be provided as shown in FIG. 17, the plating step is desirably combined with selective plating of copper or the like onto the other surfaces of the metal layer means which are to be soldered as has been described above.

Figure 19:
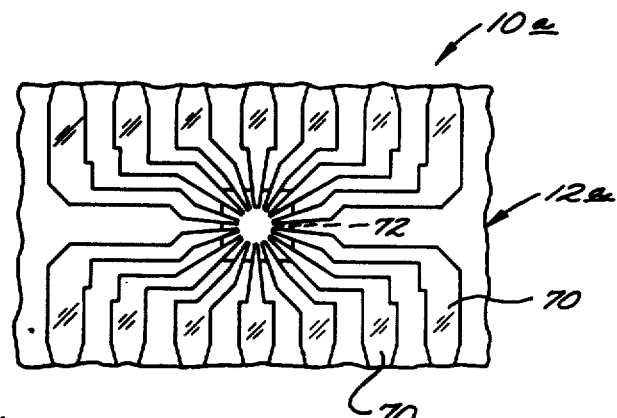
FIGS. 19-21 are partial plan views to enlarged scale similar to FIG. 1 illustrating the mounting of alternate integrated circuit devices and the like in an interconnection system corresponding to that illustrated in FIG. 1.
Figure 20:
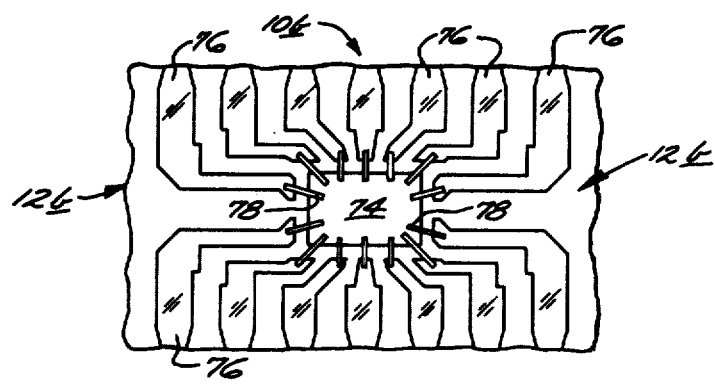
Figure 21:
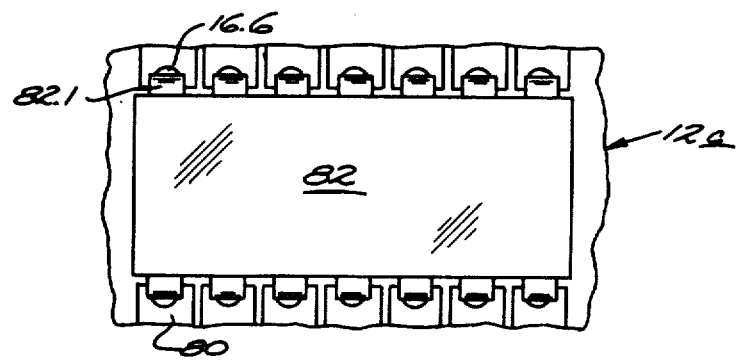

In accordance with this invention, the substrate means of the above described interconnection systems are also adapted to mount and to electrically interconnect various other types of semiconductor means as is illustrated in FIGS. 19-21. Thus, in the system 10a illustrated in FIG. 19, the substrate means 12a is provided with circuit path means 70, and a flip-chip type of i.c. unit (as diagrammatically indicated by the broken lines 72) is mounted on those circuit path means 70 in a conventional manner.

Alternately, in the system 10b shown in FIG. 20, a chip 74 of semiconducting silicon material having an integrated circuit embodied therein is mounted directly on a device mounting pad 16.1 (not shown) on the substrate means 12b in closely spaced relation to other circuit path means 76 provided on the substrate means 12b. The terminals of the chip are then electrically interconnected with the circuit path means 76 by thermal compression bond means 78 as indicated in FIG. 20.

In another alternate embodiment of the invention, the circuit path means 80 are provided in a substrate means 12c as shown in FIG. 21, and a dual-in-line integrated circuit unit 82 has terminals or leads 82.1 inserted into apertures 16.6 (not shown) in the substrate means 12c located in the circuit path means 80 as will be understood and soldered to the circuit path means for electrically connecting the dual-in-line package to the circuit path means.

Figure 24:
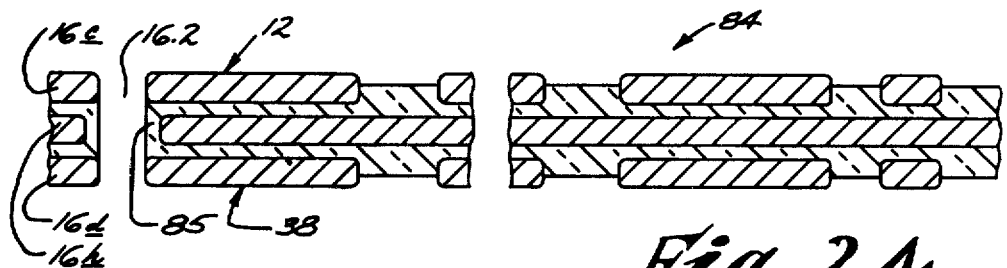
FIGS. 24-27 illustrate other alternate embodiments of this invention.

In another alternate embodiment of this invention, the system incorporates a substrate means 84 as shown in FIG. 24. A single metal layer 16b is provided with slightly larger apertures 16.6 by etching or in any other conventional way but the metal layer otherwise primarily comprises a support and heat-sink member. Single layer substrates such as the substrates 12 and 38 previously descrived are arranged on either side of the support layer 16h; the apertures 16.6 of the support layer and substrates are aligned; and the substrate coatings are fused to the support layer to fully cover the support plate to from the multilayer substrate means 84 as shown in FIG. 24. In that way, the substrate means 84 is provided with improved strength and heat-sink properties as will be understood. If desired, fused glass as at 85 permits the metal layers 16c and 16d to be connected by a plated via in the apertures 16.6 as will be understood.

Figure 25:
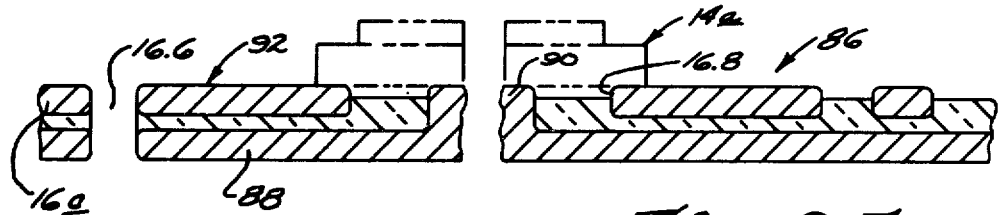

In a similar embodiment, the system incorporates substrate means 86 in which a central support and heat-sink layer 88 of copper or other thermally conductive metal is formed from a profile-rolled plate or the like so that platforms are elevated above the general plane of the support layer at selected locations as indicated at 90 in FIG. 25. A single layer substrate means 92, similar to the previously described substrate 12 but having large apertures 16.8 at the locations where pads 16.1 were provided in the substrate 12, is arranged so that the apertures 16.8 fit over the platforms 90. The glass coating of the substrate 92 is then fused to the support plate 88 as illustrated in FIG. 25, whereby the platforms 90 are adapted to be secured by soldering or the like in close heat-transfer relation to semiconductor means indicated at 14a in FIG. 25. Terminals of the semiconductor means are secured to circuit paths in the substrate means 92 as will be understood. In that way, the substrate means 86 provides even further improved heat-sink properties.

Figure 26:
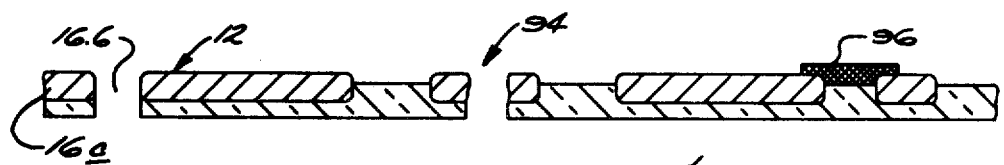

In another embodiment of this invention, the system includes substrate means 94 having hybrid circuit features such as a resistor 96 embodied in the substrate means as shown in FIG. 26. That is, a substrate 12 as previously discribed has a metal material 96 of high electrical resistivity deposited on the substrate. The resistance material 96 is deposited to extend between selected circuit path conductors in the substrate 12 and is preferably fused on the substrate in any conventional manner. In that way, the resistance means 96 is incorporated in the system circuit. The use of high temperature glass coating means in the substrate 12 facilitates incorporating such hybird circuit features in the system as will be understood.

Figure 27:
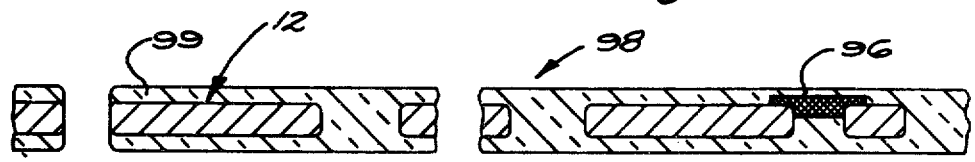

In a further embodiment of this invention as shown in FIG. 27, the system incorporates substrate means 98 in which hybrid circuit features such as the resistor 96 are fully encapsulated in the substrate means. That is, a substrate 12 is provided with a resistor 96 as above described and additional glass coating means 99 is fused over the resistor as shown in FIG. 27. If desired, additional substrate means 12 and 38 are then fused to opposite sides of the substrate means.

It should be understood that although particular embodiments of this invention have been described above by way of illustrating the invention, the invention includes all modifications and equivalents of the disclosed embodiments falling within the scope of the appended claims.

We claim:

1. An electronic circuit interconnection system comprising a substrate means having a plurality of circuit path means arranged in spaced electrically insulated relation to each other and electronic semiconductor means mounted on the substrate means and electrically interconnected with the circuit path means, characterized in that the semiconductor means have portions formed of inorganic material having selected thermal expansion properties and carry metal conductors which are fixedly connected in electrically and thermally conducting relation to the circuit path means, and the substrate means has a plurality of portions of a metal layer means defining respective portions of said circuit path means embedded in electrically insulating inorganic means for securing the circuit path means defined by said metal layer portions in said spaced electrically insulated relation to each other, the metal layer means and the inorganic embedding means being selected and proportioned relative to each other to provide the substrate means with thermal expansion properties corresponding to those of the semiconductor means to maintain the integrity of the fixed electrical connections of the metal conductors to the circuit path means during temperature cycling of the system and to provide the substrate means with thermal conductivity sufficient to maintain the semiconductor means at safe temperatures during system operation.

2. An electronic circuit interconnection system as set forth in claim 1 wherein said semiconductor means comprises an integrated circuit unit having an integrated circuit embodied in a chip of semiconducting silicon material and having terminals on the chip for electrically connecting the chip circuit with other circuit means, said metal conductors being fixedly bonded to said terminals and to the circuit path means on the substrate means.

3. An electronic circuit interconnection system as set forth in claim 2 wherein the integrated circuit chip is mounted on a ceramic chip-carrier having said metal conductors bonded to the chip-carrier to extend between the terminals and the circuit path means on the substrate means.

4. An electronic circuit interconnection system as set forth in claim 2 wherein the integrated circuit chip is mounted on a pliable tape having said metal conductors bonded to the tape to extend between the terminals and the circuit path means on the substrate means.

5. An electronic circuit interconnection system as set forth in claim 2 wherein the integrated circuit chip is mounted on a metal lead frame, said metal conductors comprise frame leads which are bonded to said circuit path means on the substrate means, and additional conductors are bonded to the chip terminals and to the frame leads for electrically connecting the integrated circuit of the chip to the frame leads.

6. An electronic circuit interconnection system as set forth in claim 2 wherein the integrated circuit unit is a flip-chip unit having said terminals located on one side of the chip, and wherein said metal conductors comprise solder connections fixedly connecting the chip terminals to the circuit path means on the substrate means.

7. An electronic circuit interconnection system as set forth in claim 2 wherein said integrated circuit chip is mounted directly on said metal layer means in heat-transfer relation thereto and said metal conductors are bonded to the chip terminals and to the circuit path means on the substrate means.

8. An electronic circuit interconnection system as set forth in claim 1 having glass frit means fused in situ to selected portions of the metal layer means defining said circuit path means to secure the circuit path means in said spaced electrically insulated relation to each other and to cooperate with the metal layer means to provide the substrate means with said terminal expansion properties corresponding to those of said semiconductor means.

9. An electronic circuit interconnection system as set forth in claim 8 wherein the metal layer means comprises a metal layer having one side embedded in the fused glass means and having an opposite side exposed from the embedding glass means, the semiconductor means being mounted directly on said opposite layer side and having said metal conductors thereof fixedly bonded to said opposite layer side to be in close heat-transfer relation to the metal layer.

10. An electronic circuit interconnection system as set forth in claim 8 wherein said metal layer means defining said circuit path means comprises a layer of metal having both sides thereof embedded in said glass means, the embedding glass means having openings therein receiving said metal conductors for electrically and thermally connecting the conductors to the metal layer.

11. An electronic circuit interconnection system as set forth in claim 8 wherein said metal layer means defining said circuit path means comprises a plurality of metal layers secured in spaced stacked relation to each other by said fused glass means.

12. An electronic circuit interconnection system as set forth in claim 11 wherein a first one of said metal layers defines said circuit path means and a second one of the layers is secured to the first layer to support and supplement the heat-sink properties of the first layer.

13. An electronic circuit interconnection system as set forth in claim 12 wherein said first metal layer has an opening of substantial size therein, and the second metal layer has a platform portion thereof elevated from the general plane of the second layer to extend into said large opening, at least one of the semiconductor means being mounted on the platform in close heat-transfer relation to the second layer.

14. An electronic circuit interconnection system as set forth in claim 8 wherein the metal layer means includes a first metal layer defining at least some of said circuit path means, and having said glass first means fused to one side of said metal layer, the system having an electrical circuit component electrically connected to selected circuit path means to extend therebetween for cooperating with the semiconductor means in forming a bybird circuit.

15. An electronic circuit interconnection system as set forth in claim 14 having additional glass frit means fused over said circuit component for encapsulating the component in said substrate means.

16. An electronic circuit interconnection system as set forth in claim 14 wherein said circuit component comprises a material having high electrical resistance which is fused in situ to the substrate means.

17. An electronic circuit interconnection system as set forth in claim 1 wherein the metal layer means defining the circuit path means comprises at least one composite metal laminate, the laminate having a plurality of layers of different metal materials bonded together to cooperate with said inorganic means to provide the substrate means with said thermal expansion and said thermal conductivity properties.

18. An electronic circuit interconnection system as set forth in claim 17 wherein said metal laminate includes a layer of metal of relatively high thermal conductivity and a layer of metal of relatively low thermal expansion properties.

19. An electronic circuit interconnection system as set forth in claim 17 wherein an outer layer of the laminate is formed of a metal material having relatively high bondability with respect to fused glass and the embedding means comprises glass means fused to said outer laminate layer.

20. An electronic circuit interconnection system as set forth in claim 17 wherein corresponding layers of the metal laminate are disposed symmetrically relative to the central plane of the laminate for assuring that the circuit path means defined by the laminated tend to remain flat during thermal cycling thereof.

21. An electronic circuit interconnection system comprising a substrate means having a plurality of circuit path means arranged in spaced electrically insulated relation to each other and electronic semiconductor means mounted on the substrate means and electrically interconnected with the circuit path means, characterized in that the semiconductor means have portions formed of inorganic material having selected thermal expansion properties and carry metal conductors which are fixedly connected in electrically and thermally conducting relation to the circuit path means, and the substrate means has portions of metal layer means defining said circuit path means embedded in electrically insulating inorganic means for securing the circuit path means in said spaced electrically insulated relation to each other, the metal layer means and the inorganic embedding means being selected and proportioned relative to each other to provide the substrate means with thermal expansion properties corresponding to those of the semiconductor means to maintain the integrity of the fixed electrical connections of the metal conductors to the circuit path means during temperature cycling of the system and to provide the substrate means with thermal conductivity sufficient to maintain the semiconductor means at safe temperatures during system operation, the metal layer means defining the circuit path means comprising at least one composite metal laminate having a plurality of layers of different metal materials bonded together to cooperate with said inorganic means to provide the substrate means with said thermal expansion and said thermal conductivity properties, said metal laminate including a layer of metal of relatively high thermal conductivity and a layer of metal of relatively low thermal expansion properties, said metal laminate having a central layer of a copper material of relatively high thermal and electrical conductivity and outer metal layers of equal thickness of an iron alloy material of relatively low thermal expansion properties, and the embedding means comprising glass means fused to at least one of the outer layers of the laminate.

22. An electronic circuit interconnection system as set forth in claim 21 wherein the iron alloy material is selected from the group of alloys having a nominal composition by weight of from about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum, and the balance iron, of about 57 percent cobalt, 9 percent chromium and the balance iron, and of about 23 to 30 percent nickel, about 17 to 30 percent cobalt about 0.6 to 0.8 percent manganese and the balance iron.

23. An electronic circuit interconnection system comprising a substrate having a plurality of circuit paths arranged in spaced electrically insulated relation to each other and having a plurality of electronic semiconductor units mounted on the substrate electrically interconnected with the circuit paths, characterized in that the semiconductor units each have an integrated circuit embodied in a chip of semiconducting silicon material, have terminals on the chip for electrically connecting the chip circuit with other circuit means, have a ceramic chip carrier mounting the chip thereon, and have metal conductors electrically connected to the chip terminals and bonded to selected portions of the chip carrier, and the substrate embodies a composite metal laminate having a plurality of portions thereof defining the circuit paths and has glass means embedding those laminate portions for securing the circuit paths in said spaced electrically insulated relation to each other, the laminate portions each having a central layer of a copper material of relatively high electrical and thermal conductivity and each having outer layers of iron alloy material of relatively low coefficient of thermal expansion metallurgically bonded to opposite sides of the central layer, the semiconductor carriers being mounted on the substrate with the metal conductors thereof fixedly secured in thermally and electrically conductive relation to said circuit paths, and a glass means being fused to iron alloy layers of the laminate and being proportioned relative to said laminate portions to provide the substrate with thermal expansion properties corresponding to those of the semiconductor units to maintain the integrity of the fixed connections of the unit conductors to the circuit paths during temperature cycling of the system and to provide the substrate with thermal conductivity sufficient to maintain the plurality of semiconductor units at safe temperatures on the substrate during system operation.

24. An electronic circuit interconnection system as set forth in claim 23 wherein said portions of the metal laminate each have one side embedded in said fused glass means and have an opposite side exposed from the embedding glass means, and respective chip carriers are mounted on selected ones of the laminate portions on said opposite sides thereof and have said metal conductors thereof fixedly bonded to others of said metal laminate portions in close heat-transfer relation to the laminate material.

25. An electronic circuit interconnection system as set forth in claim 24 having additional metal layer means embedded in said glass means and secured in stacked relation to the composite metal laminate by said glass means.

26. An electronic circuit interconnection system as set forth in claim 25 wherein the additional metal layer means define other circuit paths, and metal conductors extend through openings in the fused glass means electrically interconnecting circuit paths on the laminate and on the additional metal layer means.

27. An electronic circuit interconnection system as set forth in claim 26 wherein the additional metal layer means includes a layer of metal having both sides thereof embedded in said glass means.

* * * * *